United States Patent
Inoue (10) Patent No.: US 7,915,069 B2
(45) Date of Patent: Mar. 29, 2011

(54) SOLID-STATE IMAGING DEVICE COMPRISING AN N-TYPE LAYER DIVIDED INTO A LOWER AND UPPER LAYER BY FORMING A P-TYPE REGION

(75) Inventor: Ikuko Inoue, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/752,222

(22) Filed: Apr. 1, 2010

(65) Prior Publication Data

US 2010/0190289 A1    Jul. 29, 2010

Related U.S. Application Data

(63) Continuation of application No. 11/874,479, filed on Oct. 18, 2007, now abandoned.

(30) Foreign Application Priority Data

Oct. 19, 2006   (JP) .................................. 2006-285342

(51) Int. Cl.
    *H01L 21/00*    (2006.01)
(52) U.S. Cl. .... 438/73; 438/419; 257/292; 257/E27.162
(58) Field of Classification Search .................. None
    See application file for complete search history.

(56) References Cited

U.S. PATENT DOCUMENTS

| | | | | |
|---|---|---|---|---|
| 5,962,882 A | * | 10/1999 | Sin | 257/222 |
| 6,403,994 B1 | * | 6/2002 | Wada | 257/229 |
| 7,205,584 B2 | | 4/2007 | Rhodes et al. | |
| 2006/0219867 A1 | | 10/2006 | Yamaguchi et al. | |
| 2008/0251822 A1 | | 10/2008 | Yamaguchi et al. | |
| 2008/0265295 A1 | * | 10/2008 | Brady | 257/291 |

FOREIGN PATENT DOCUMENTS

| | | |
|---|---|---|
| JP | 2001-160620 | 6/2001 |
| JP | 2001-223351 | 8/2001 |

* cited by examiner

*Primary Examiner* — Evan Pert
*Assistant Examiner* — Andres Munoz
(74) *Attorney, Agent, or Firm* — Oblon, Spivak, McClelland, Maier & Neustadt, L.L.P.

(57) ABSTRACT

An n/p semiconductor substrate is formed in such a manner that an n type semiconductor layer is deposited on a $p^+$ semiconductor substrate. An imaging area including a plurality of n type semiconductor regions making photoelectric conversion and a plurality of p type semiconductor region for isolation formed around the n type semiconductor regions, is formed in the n/p semiconductor substrate. The n type semiconductor layer is divided into an upper layer and a lower layer. A second n type semiconductor region is formed to connect to the $p^+$ type semiconductor substrate from a surface of the n/p semiconductor substrate in a peripheral region of the imaging area.

3 Claims, 8 Drawing Sheets

SOLID-STATE IMAGING DEVICE COMPRISING AN N-TYPE LAYER DIVIDED INTO A LOWER AND UPPER LAYER BY FORMING A P-TYPE REGION

CROSS-REFERENCE TO RELATED APPLICATIONS

This application is a continuation of and claims the benefit of priority under 35 U.S.C. §120 from U.S. Ser. No. 11/874,479 filed Oct. 18, 2007, and claims the benefit of priority under 35 U.S.C. §119 from Japanese Patent Application No. 2006-285342 filed Oct. 19, 2006, the entire contents of each of which are incorporated herein by reference.

BACKGROUND OF THE INVENTION

1. Field of the Invention

The present invention relates to a solid-state imaging device. In particular, the present invention relates to a CMOS type amplification-type solid-state imaging device having a substrate structure and a well structure collecting carries into a photoelectric converter. For example, the present invention is used for digital cameras, mobile phones and mobile apparatuses.

2. Description of the Related Art

The advantage of a CMOS amplification-type solid-state imaging device (hereinafter, referred to as a CMOS image sensor) is a single power supply which operates at a low voltage of, for example, about 3V and consumes low power, for example, about 50 mW of electric power. In the device, a plurality of pixels each included of a photoelectric conversion element and a plurality of transistors have been formed on a semiconductor substrate, thereby achieving a multi-pixel configuration. Each pixel has an amplifying function whereby the potential in a signal charge accumulating part is modulated by the signal charge generated by the photoelectric conversion element and the amplifying transistor in the pixel is modulated according to the modulated potential.

In a conventional CMOS image sensor, a $p/p^+$ substrate is used as a semiconductor substrate. The $p/p^+$ substrate is formed in such a manner that a P epitaxial layer having low impurity concentration is stacked on the surface of a $P^+$ substrate having high impurity concentration with about 5 to 10 μm. The reason for using the $p/p^+$ substrate is as follows. The lifetime of carrier (electron) in the portion ($P^+$ substrate) having high impurity concentration is short in a deep position of the substrate. Specifically, strong light is radiated to the photoelectric conversion element, that is, photo diode, and then, carries are generated. Even if the carrier diffuses up to the depth of the substrate, electrons are re-combined in an area where the lifetime of the carrier is short. Therefore, it is possible to prevent carries generated from the following factors from coming into neighboring photo diodes. The carries overflows from the photo diode because strong light are radiated to the photo diode, or generated by being photo-electrically converted in a deep position of the substrate. Moreover, it is possible to prevent a generation of blooming.

Recently, with scale reduction of devices, if the area of the photo diode is reduced, there is a problem that sensitivity is reduced. The features of the CMOS image sensor is low voltage drive. Thus, it is difficult to widen a depletion layer of the photo diode. For this reason, the sensitivity is improved by widening the depletion layer of the photo diode, and thereby, it is difficult to prevent reduction of the sensitivity resulting from the scale reduction of devices. In order to improve the sensitivity of the CMOS image sensor, it is important that the following substrate structure is employed. According to the substrate structure, carriers are effectively collected into the photo diode. Thus, a $p/p^+$ substrate is used. Namely, the $p/p^+$ substrate has the following two areas. One is an area having low B (boron) concentration at a shallow position of the substrate on the surface thereof. Another is an area having high B concentration at a deep position of the substrate. Thus, the $p/p^+$ substrate has an interface such that the concentration of B rapidly changes. This gives the following advantage. Specifically, even if electrons generated by photoelectric conversion are diffused to a deep position of the substrate, these electrons are bounced back to the surface of the substrate at the interface where B concentration rapidly changes. Part of the bounced electrons is collected to the photo diode to which light is radiated by diffusion. As a result, the sensitivity is improved.

The CMOS image sensor has another feature. According to the feature, a manufacturing process is close to a logic LSI; therefore, a signal processing circuit is manufactured in the same manufacturing line as an imaging element. Thus, the imaging element and the signal processing circuit are formed on one chip. As described above, the CMOS image sensor is driven using a single power and at low voltage.

One-chip CMOS image sensor thus formed can use a P substrate or $p/p^+$ substrate in accordance with the logic LSI manufacturing process. If the $p/p^+$ substrate is used, the back side of a wafer is grounded, and a stable and favorite waveform is obtained as a pulse signal generated by a logic circuit and an analog circuit. Therefore, multi-pixel or high speed operation is possible.

The advanced CMOS image sensor has multi-pixel. When scale reduction of pixel is made without changing the size of a sensor chip, the light receiving area of the photo diode is reduced, and thereby, a reduction of sensitivity of the photo diode becomes problem. Thus, it is desired to improve the sensitivity. The CMOS image sensor is driven at low voltage; therefore, if the photo diode is formed in a P type area, it is difficult to widen the depletion layer of the photo diode. For this reason, electrons photo-electrically converted between photo diodes leak to neighboring pixels. As a result, sensitivity reduction and color mixture deterioration are caused.

Accordingly, the depletion layer of the photo diode is widened to improve sensitivity, and thereby, it is difficult to employ a method of preventing the sensitivity from being reduced resulting from scale reduction. Based on the foregoing background, it is desired to provide the technique of improving the sensitivity of the CMOS image sensor having multi-pixel. The foregoing technique is disclosed in Jpn. Pat. Appln. KOKAI Publications No. 2001-160620 and 2001-223351. Moreover, it is desired to develop the technique of preventing blooming and image quality deterioration of color mixture.

There is provided a solid-state imaging device using an $n/p^+$ substrate as a substrate structure overcoming the foregoing both technical problems. The solid-state imaging device is described in the specification of assigner, that is, U.S. patent application Ser. No. 11/776,791. The $n/p^+$ substrate has a structure such that an n type semiconductor layer is deposited on a $p^+$ substrate (base substrate) by an epitaxial growth process. P (phosphorus) ion is injected into the n type semiconductor layer using an ion accelerator to form an N type semiconductor layer for the photo diode. By doing so, the depletion layer of the photo diode is easy to widen as compared with the $p/p^+$ substrate. In this way, carries are effectively collected to the photo diode without stepping up a drive voltage of the CMOS image sensor. Therefore, it is expected to provide high sensitivity and an increase of saturating signal. In addition, it is possible to use the shortness of the lifetime of carrier; therefore, blooming and image quality deterioration of color mixture are prevented. Thus, a CMOS image sensor is manufactured using the foregoing n/p+ substrate, and thereby, the foregoing problem can be solved.

On the other hand, in the CMOS image sensor using the n/p+ substrate, when strong light is incident, a signal overflows from the photo diode and flows into peripheral pixels, that is, blooming occurs. As described above, in the p+ substrate, the lifetime of carrier (electron) is short. For example, strong light and long wavelength light are incident on the photo diode, and even if carries are generated in the substrate, and thereafter, diffuse up to the deep position of the substrate, electrons are re-combined in an area where the lifetime of these carriers is short. As a result, carries generated in the deep position of the substrate do not leak into neighboring photo diodes, and blooming is prevented. However, a large number of carriers generated in a shallow area of the substrate leaks to peripheral pixels without being re-combined, and this is a factor of causing blooming.

BRIEF SUMMARY OF THE INVENTION

According to one aspect of the present invention, there is provided a solid-state imaging device comprising:

an n/p semiconductor substrate having a structure that an n type semiconductor layer is formed on a p type semiconductor substrate;

an imaging area including a plurality of first n type semiconductor regions formed in the n/p semiconductor substrate and making photoelectric conversion, and a plurality of first p type semiconductor region for isolation formed in the n/p semiconductor substrate to be positioned around the first n type semiconductor regions;

a p type semiconductor layer formed in the n type semiconductor layer, and divided into an upper layer and a lower layer; and a second n type semiconductor region formed to connect to the p type semiconductor substrate from a surface of the n/p semiconductor substrate in a peripheral region of the imaging area.

DETAILED DESCRIPTION OF THE INVENTION

Various embodiments of the present invention will be hereinafter described with reference to the accompanying drawings. In the following description, the same reference numerals are used to designate portions common to all drawings.

Figure 1:
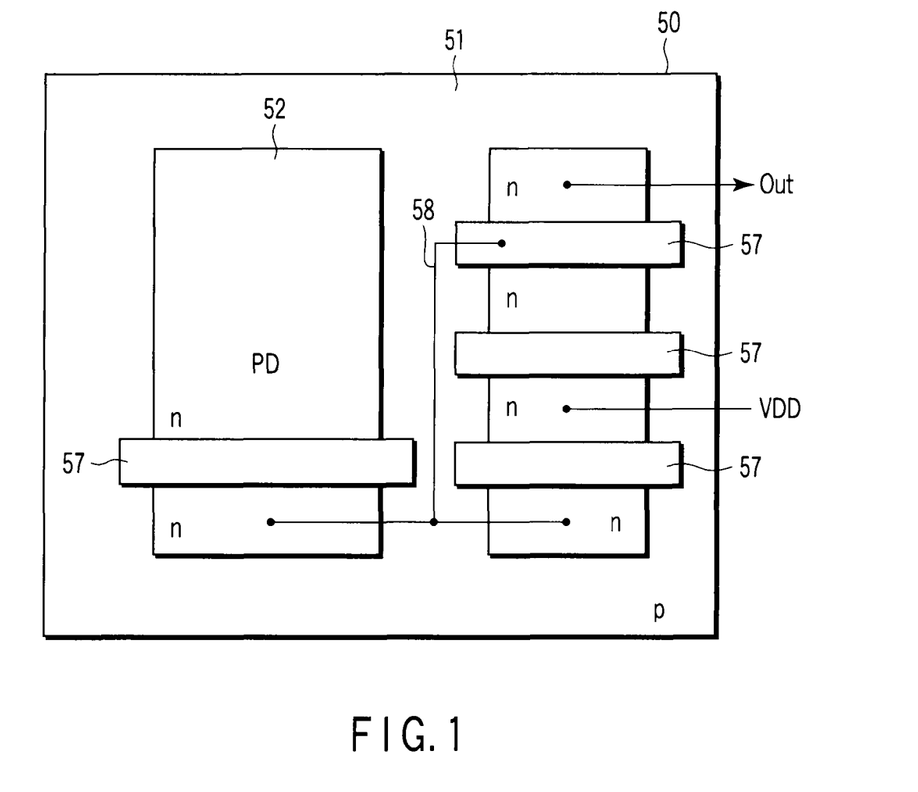
FIG. 1 is a top plan view showing a pattern arrangement of a unit cell of a CMOS image sensor according to the present invention.
Figure 2:
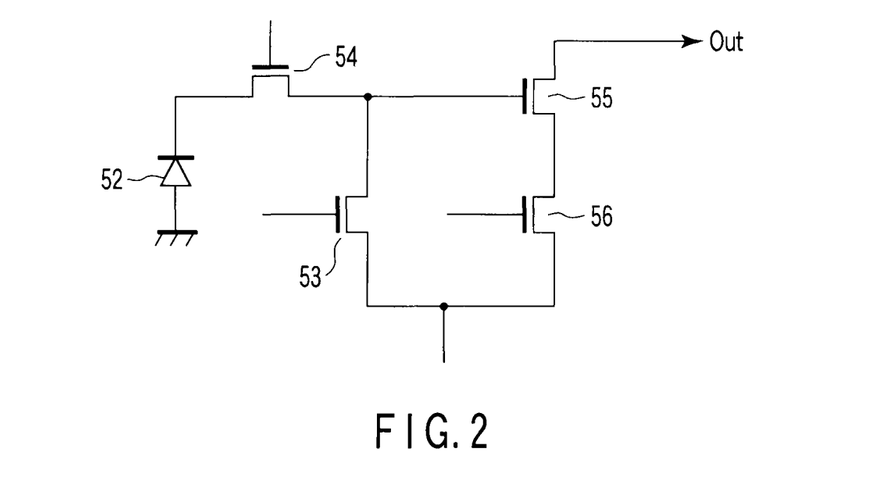
FIG. 2 is an equivalent circuit diagram of the unit cell shown in FIG. 1.

In CMOS image sensors according to various embodiments of the present invention, a plurality of unit pixel (unit cell) are integrated on a semiconductor substrate composed of an n/p+ substrate. FIG. 1 shows a pattern plan view of an imaging area where unit pixel (unit cell) of the CMOS image sensor is formed. FIG. 2 shows an equivalent circuit diagram of the unit cell shown in FIG. 1.

As shown in FIG. 1, a unit cell area 50 is surrounded with an isolation area 51 formed on the surface layer of a semiconductor substrate. A plurality of unit cell areas 50 is isolated from each other by the isolation area 51. Each unit cell area 50 is formed with a photo diode (PD) 52 and an N type active region composed of plural transistors, that is, the following transistors shown in FIG. 2. One is a reset transistor 53, another is a read transistor 54, another is an amplifying transistor 55, and another is an address transistor 56. A gate electrode (gate interconnect) 57 of the foregoing each transistor is formed on the semiconductor substrate via a gate insulating film. Further, an interlayer insulating film and a metal interconnect layer 58 are formed.

First Embodiment

Figure 3:
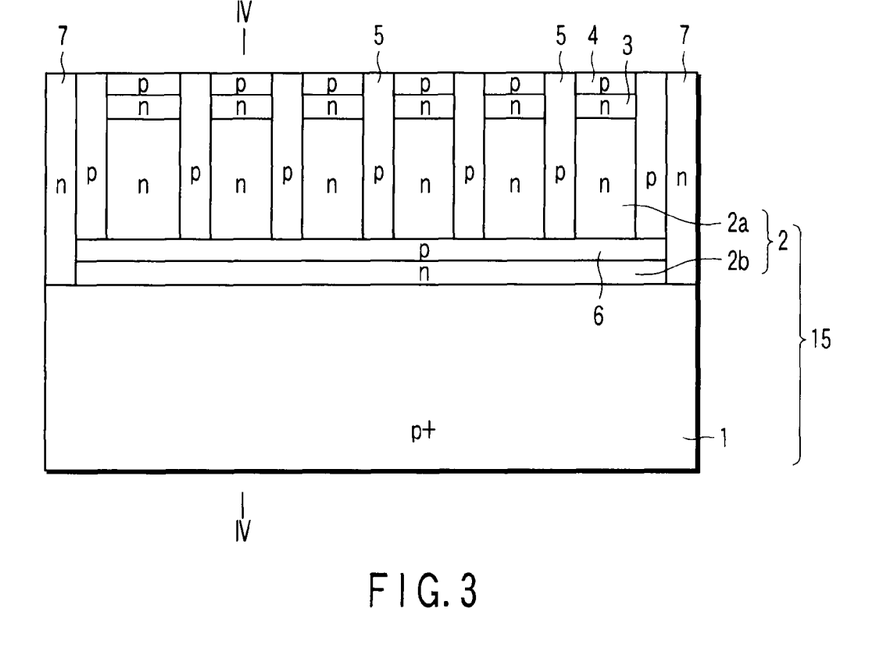
FIG. 3 is a cross-sectional view showing a CMOS image sensor according to a first embodiment of the present invention.

FIG. 3 is a cross-sectional view showing a CMOS image sensor according to a first embodiment. FIG. 3 shows an array in which a plurality of unit cell shown in FIG. 1 is arranged. In FIG. 3, a semiconductor substrate 15 comprises an n/p+ substrate 15 having a two-layer semiconductor structure. An n type semiconductor layer (hereinafter, referred to as n-Epi layer) 2 is deposited on a base substrate, that is, p+ substrate 1 via an epitaxial growth process. In the p+ substrate 1, p type impurity concentration is relatively high, and for example, impurity concentration of B (boron) is about $2 \times 10^{18}$ cm$^{-3}$. In the n-Epi layer 2, n type impurity concentration, for example, impurity concentration of P (phosphorus) is about $2 \times 10^{15}$ cm$^{-3}$. The n-Epi layer 2 has a thickness of 5μ, for example. When the n/p+ substrate is formed, the growth rate of the n-Epi layer 2 is set to about 1 μm/minute. By doing so, B dose not almost diffuse (move) from a deep position (deep layer) of the semiconductor substrate, that is, the p+ substrate 1 toward the n-Epi layer 2. Therefore, the gradient of the profile of B concentration becomes steep in the interface between the p+ substrate 1 and the n-Epi layer 2, as described later. In a stocked state that the n/p+ substrate 15 is formed, the interface (pn junction surface) between the p+ substrate 1 and the n-Epi layer 2 is situated at the depth of about 5 μm from the surface of the n/p+ substrate.

For example, P ion is further implanted to part (imaging area) of the n-Epi layer 2 using a known method. In this way, a plurality of n type semiconductor region (hereinafter, referred to as n region) 3 of plural photo diodes is formed. The peak depth of P concentration of each n region 3 determines mainly depending on acceleration energy when P ion is implanted. Portions in the vicinity of the surface of the photo diodes are sealed. Thus, a plurality of p type semiconductor layer (PD-p layer) 4 containing p type impurity having relatively high concentration, for example, B of about $1 \times 10^{19}$ cm$^{-3}$ is formed.

A plurality of p type semiconductor regions 5 is formed to surround the photo diode every unit pixel. The diodes are electrically isolated from each other via each p type semiconductor region 5. In the imaging area, a part of the n-Epi layer 2 near the p$^+$ substrate 1 is formed with a p type semiconductor layer 6 parallel with the p$^+$ substrate 1 by B ion implantation. The n-Epi layer 2 of the imaging area is divided into an upper layer 2a and a lower layer 2b by the p type semiconductor layer 6. The B concentration of the p type semiconductor layer 6 is set to equal to or lower than the B concentration of the pixel isolation p type semiconductor region 5. The peripheral portion of the imaging area is formed with an n type semiconductor region 7 connected with the lower layer 2b of the n-Epi layer 2 from the surface.

When the CMOS image sensor having the foregoing structure is operated, positive potential is applied to the n type semiconductor region 7. When strong light is incident on the n region 3 of the photo diode of the imaging area, a large number of carries are generated in the substrate by photoelectrical conversion. In this case, carries generated in the p$^+$ substrate 1 is re-combined. However, carriers generated in an area shallower than the p$^+$ substrate 1 overflow from there; as a result, flows into the peripheral pixel area. In this embodiment, the p type semiconductor layer 6 having concentration equal to or lower than the B concentration of the pixel isolation p type semiconductor region 5 exists on the side of the p$^+$ substrate 1. Therefore, excessive electrons pass through the p type semiconductor layer 6, and then, flow into the lower layer 2b of the n-Epi layer existing under the p type semiconductor layer 6. The lower layer 2b of the n-Epi layer 2 is electrically connected with the n type semiconductor region 7 around the imaging area. Positive potential is applied to the n type semiconductor region 7. Therefore, electrons overflowing from the pixel area are discharged via the lower layer 2b of the n-Epi layer and the n type semiconductor region 7. Thus, this serves to reduce blooming in the CMOS image sensor of the first embodiment.

The process of manufacturing the CMOS image sensor of the first embodiment will be hereinafter described with reference to FIG. 3. In the following description, the process of forming an imaging area will be mainly described.

An n/p$^+$ substrate 15 having a two-layer structure is prepared. When the n/p$^+$ substrate 15 is manufactured, a p$^+$ substrate (Si substrate) 1 having B concentration of $2 \times 10^{18}$ cm$^{-3}$ is used as a base substrate. An n-Epi layer 2 having P concentration of $2 \times 10^{15}$ cm$^{-3}$ is deposited on the p$^+$ substrate having a thickness about 5 μm, for example. Usually, in the n/p$^+$ substrate 15, an epitaxial layer is stacked at about 1 μm/minute. In this case, B does not almost diffuse (move) from a deep position of the substrate to the surface thereof. Thus, the gradient of the profile of the impurity concentration steeply changes in the vicinity of the interface between the p$^+$ substrate 1 and the n-Epi layer 2.

The foregoing n/p$^+$ substrate 15 is treated at 1150° C. for about 1.5 hours so that B of the p$^+$ substrate 1 thermally diffuse to the surface thereof. As a result, p well having B concentration of about $2 \times 10^{15}$ cm$^{-3}$ in the vicinity of the depth 2μ from the substrate surface is formed. Thus, a pn junction interface between the n-Epi layer 2 and seepage of B from p$^+$ substrate is formed at the substrate depth of about 2 μm. As a result, the following structure is obtained. Specifically, the lifetime of carrier is short in a position deeper than about 5 μm from the substrate surface and the deep portion of the substrate; therefore, carries immediately re-combine. Generated electrons are potentially pushed onto the substrate surface in a 5 μm shallow position from there.

The surface layer of the n-Epi layer 2 is formed with a plurality of photo diodes are independently provided as a photoelectrical converter by a normal process. Specifically, a resist film is coated on the surface of the n-Epi layer 2, and then, patterned. Then, n type impurity, that is, P ion is implanted into the surface layer of the n-Epi layer 2 to plural n type semiconductor regions (n region) 3. In this case, the peak depth of P concentration mainly determines depending on the magnitude of energy when P ion is implanted. According to this embodiment, the implantation condition of P ion is as follows.

Acceleration voltage: 300 KeV
Dose: $1.2 \times 10^{12}$ cm$^{-2}$

By doing so, the P concentration peak is formed as a P concentration profile of the n region 3 at about 0.4 μm depth from the substrate surface.

In order to obtain a photo diode having a surface shield sensor (S3) structure, the surface layer of each photo diode is sealed with the p type semiconductor layer (PD-p layer) 4. Specifically, a resist film is coated on the surface of each photo diode, and then, patterned, and thereafter, B ion is implanted. In this case, B ion is implanted at acceleration voltage: 300 KeV, and dose of $1 \times 10^{13}$ cm$^{-2}$. As a result, the n region 3 making photoelectrical conversion is buried in the surface layer (n-Epi layer) of the n/p$^+$ substrate. Thus, a plurality of S3 structure photo diodes sealed with the PD-p layer 4 having p type impurity having high concentration (about $1 \times 10^{19}$ cm$^{-3}$) on its surface is formed.

Thereafter, in order to isolate the n region of each photo diode in the n-Epi layer 2, a shallow trench isolation (STI) region formed of a silicon oxide film as an isolation region are formed around the n region 3 of each photo diode. Each STI region is formed at a depth position of about 0.3 to 0.35 μm from the surface of the n-Epi layer 2. A plurality of p type semiconductor region 5 is formed under each STI region from the surface of the n-Epi layer 2 toward the p$^+$ layer 1 in a planer pattern independently surrounding the n region 3 of each photo diode. Each p type semiconductor region 5 is formed by implanting B ion into the n-Epi layer 2 as a p type impurity several times. In each p type semiconductor region 5 of plural-layer p type semiconductor region 5, B concentration in the center becomes higher than that in the peripheral portions.

According to this embodiment, five-time B ion implantations are carried out in order to form a five-layer p type semiconductor region 5. The condition of acceleration voltage/dose in five-time B ion implantation is set to the following order. For example, the order is about 200 KeV/$7 \times 10^{12}$ cm$^{-2}$, about 400 KeV/$5 \times 10^{11}$ cm$^{-2}$, about 650 KeV/$5 \times 10^{11}$ cm$^{-2}$, about 1100 KeV/$5 \times 10^{11}$ cm$^{-2}$, and about 1500 KeV/$5 \times 10^{11}$ cm$^{-2}$. B ion is implanted according to the foregoing condition, and thereby, the n-Epi layer 2 between each STI region and the surface layer of the p$^+$ substrate is filled with the five-layer p type semiconductor region 5 without a gap. Thus, the n-Epi layer 2 is substantially formed into a p type semiconductor. The plural p type semiconductor regions 5 function as a barrier layer electrically isolating from n region 3 of other photo diode adjacent to n region of each photo diode.

As described above, the p type semiconductor region 5 is formed by implanting B ion. Preferably, B ion is simultaneously implanted into a chip cut portion (dicing line) cutting the n/p+ substrate 15 into some chips. By doing so, a p type semiconductor region is continuously formed along the dicing line and from the surface of the n-Epi layer 2 to the surface layer of the p⁺ substrate 1. Thus, the surface of the n-Epi layer 2 is formed as a p type semiconductor with the p⁺ substrate 1.

According to the foregoing process, each p type semiconductor region 5 as a barrier layer and each p type semiconductor region of the dicing line are simultaneously and readily formed without increasing the number of processes. In each dicing line, no pn junction surface appears in the chip section when the n/p+ substrate 15 is cut into some chips along the dicing line in the after-process. This is because the dicing line composed of the p type semiconductor region and the p⁺ substrate 1 from the surface to the backside.

Resist is selectively coated on the imaging area, and then, patterned. A p type diffusion layer 6 is formed so that the n-Epi layer 2 is separated into upper and lower layers 2a and 2b at the pn junction interface, that is, a depth position of about 2 μm and connects with the bottom of the p type semiconductor region 5. In this case, the condition of acceleration/dose in ion implantation is about 1700 KeV/3×10¹¹ cm⁻². The p type diffusion layer 6 may be formed at a desired position using a mask, and may be formed on the entire surface of wafer. The p type diffusion layer 6 functions as a barrier layer for discharging carriers generated in the n-Epi layer 2 to the lower layer 2b of the n-Epi layer 2. Therefore, the impurity concentration must be lower than the isolation p type semiconductor region 5.

The peripheral portion of the imaging area is formed with an n type semiconductor region 7 by implanting P ion so that it connects to the lower layer 2b of the n-Epi layer 2 from the substrate surface. According to this embodiment, P ion implantation is carried out three times in order to for a three-layer n type semiconductor region 7, for example. The condition of acceleration voltage/dose in the three-time P ion implantation is set to the following order. For example, the order is about 200 KeV/5×10¹² cm⁻², about 1300 KeV/2×10¹³ cm⁻², and about 2 MeV/1×10¹³ cm⁻².

Thereafter, well region of a peripheral circuit area is formed using a desired mask by a normal process. Gates for forming transistors and capacitors, gate interconnect, drain/source region and so on are formed. Further, Al interconnect is formed to form a CMOS image sensor.

Thereafter, the n/p⁺ substrate 15 is diced into a chip unit along the dicing line. In this way, a CMOS image sensor chip formed using the n/p⁺ substrate 15 and having a desired structure is obtained.

Figure 4:
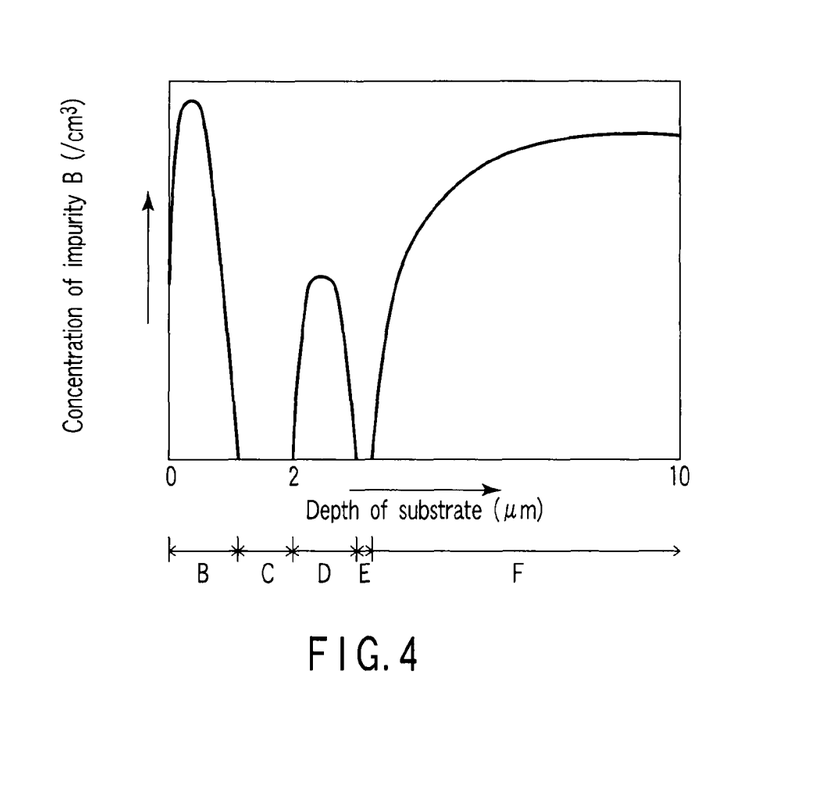
FIG. 4 is a graph showing impurity concentration distribution taken along the line IV-IV shown in FIG. 3.
Figure 5:
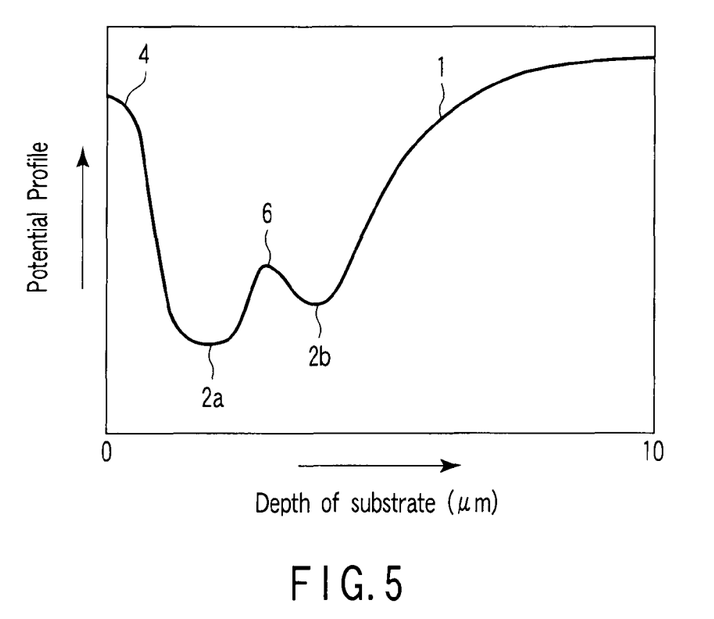
FIG. 5 is a graph showing a potential profile distribution corresponding to FIG. 4.

FIG. 4 shows one example of a (B) impurity concentration profile in a photo diode along the line IV-IV shown in FIG. 3 and its lower depth direction. FIG. 5 shows one example of a potential distribution corresponding to FIG. 4.

Of various areas of the impurity concentration profile shown in FIG. 4, an area B denotes a shield layer, that is, an area of PD-p layer 4. An area C denotes an area of the n region 3 of the photo diode and the upper layer 2a of the n-Epi layer. An area D denotes an area of the p type impurity layer 6. An area E denotes an area of the lower layer 2b of the n-Epi layer. An area F denotes an area of the p⁺ substrate 1.

As is evident from the impurity concentration profile shown in FIG. 4, impurity of each layer is different in the interface the upper layer 2a of the n-Epi layer positioned at the depth of about 2 μm from the substrate surface and the p type impurity layer 6. Therefore, the impurity concentration rapidly changes; thus, a steep profile is given. Moreover, the impurity of each layer is different in the interface between the p type impurity layer 6 and the lower layer 2b of the n-Epi layer. Therefore, the impurity concentration rapidly changes.

As seen from the potential distribution shown in FIG. 5, the potential gradually reduces from the shield layer, that is, the area of the PD-p layer 4 to the upper layer 2a of the n-Epi layer. The potential becomes the minimum (smallest) at the upper layer 2a of the n-Epi layer. The potential gradually increases from the upper layer 2a of the n-Epi layer to the p type impurity layer 6. Then, the potential gradually reduces from the p type impurity layer 6 to the lower layer 2b of the n-Epi layer. The potential again gradually increases from the lower layer 2b of the n-Epi layer to the p⁺ substrate 1. Thus, the potential becomes the maximum at the depth portion of the substrate.

Second Embodiment

Figure 6:
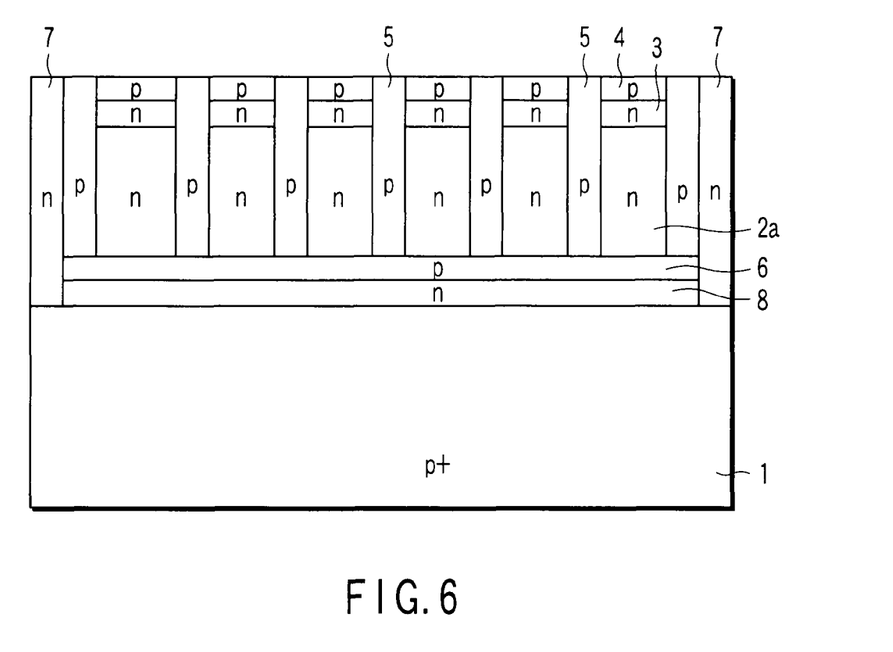
FIG. 6 is a cross-sectional view showing a CMOS image sensor according to a second embodiment of the present invention.

FIG. 6 is a cross-sectional view showing a CMOS image sensor according to a second embodiment. According to the second embodiment, P ion is implanted into the lower layer 2b of the n-Epi layer of the first embodiment under the condition that acceleration voltage is about 2 MeV, and dose is 1×10¹³ cm⁻². In this way, an n type drain layer 8 having impurity concentration of about 1×10¹³ cm⁻³ is formed.

According to the second embodiment, the n type drain layer 8 having high impurity concentration is formed, and thereby, the resistance of the n type drain layer 8 becomes low. Therefore, potential is deeply given. By doing so, extra electrons from the n region 3 of the photo diode is sufficiently absorbed into the n type drain layer 8 as compared with the first embodiment. In addition, positive potential is applied to the n type semiconductor region 7; therefore, electrons can be readily discharged. Thus, even if the CMOS image sensor further is made into multi-pixel, extra electrons are sufficiently discharged, and it is possible to prevent blooming.

Third and Fourth Embodiments

Figure 7:
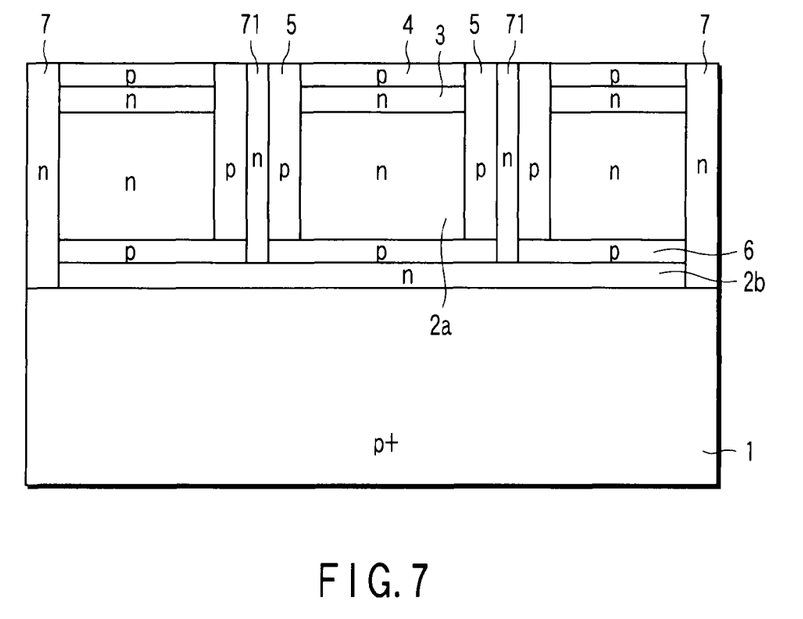
FIG. 7 is a cross-sectional view showing a CMOS image sensor according to a third embodiment of the present invention.
Figure 8:
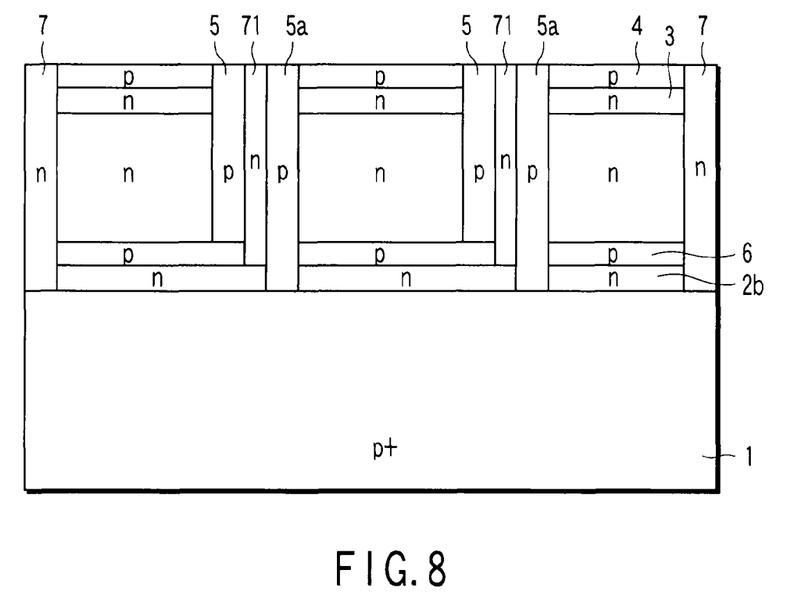
FIG. 8 is a cross-sectional view showing a CMOS image sensor according to a fourth embodiment of the present invention.

FIG. 7 and FIG. 8 are cross-sectional views showing CMOS image sensors according to third and fourth embodiments, respectively. According to the third embodiment, the n type semiconductor region 7 of the first embodiment is formed in each pixel. Therefore, even if a multi-pixel CMOS image sensor is given, extra electrons are uniformly discharged.

In FIG. 7, a plurality of n type semiconductor regions 71 are formed in the center portion of an isolation p type semiconductor region 5 of the pixel. According to the fourth embodiment shown in FIG. 8, in the structure of FIG. 7, at least part 5a of the isolation p type semiconductor region 5 of each pixel is formed to be connected to the p⁺ substrate 1. By doing so, extra electrons of each pixel are discharged every pixel, and isolation of each pixel is reinforced. In addition, ground potential of a transistor of the imaging area is given to the p⁺ substrate 1; therefore, ground potential is stabilized.

Fifth Embodiment

Figure 9:
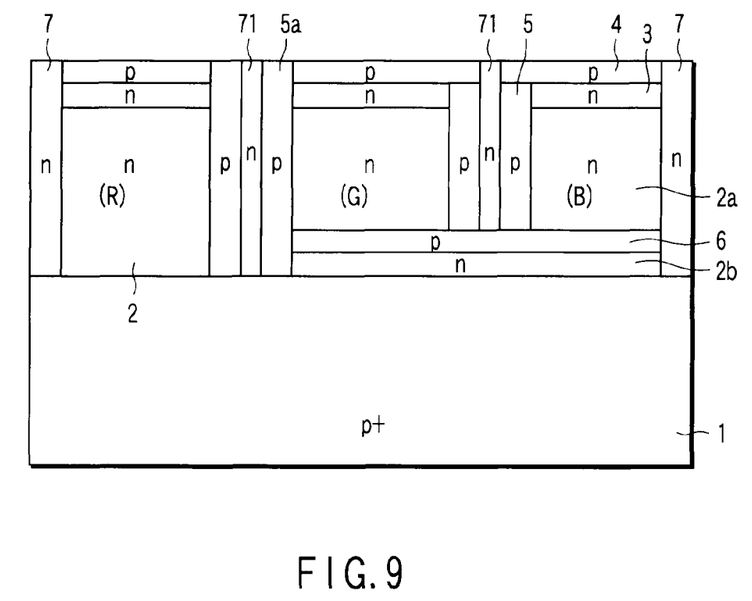
FIG. 9 is a cross-sectional view showing a CMOS image sensor according to a fifth embodiment of the present invention.

FIG. 9 is a cross-sectional view showing a CMOS image sensor according to a fifth embodiment. The fifth embodiment is basically the same as the third and fourth embodiments; however, it differs from the third and fourth embodiments in the following point. No p type semiconductor layer 6 is formed in the pixel on which red (R) light is incident of each pixel divided corresponding to light primary color RGB by a color filter (not shown) placed on a light incident surface. The p type semiconductor layer 6 is formed in the pixel on which blue (B) or green (G) light is incident.

The red light has long wavelength, and photo-electrically converted in the deep portion of the substrate. For this reason, each pixel is provided with an n type semiconductor region 71 for each pixel. Positive potential is applied to the n type semiconductor region 71 to discharge electrons, and thereby, red sensitivity is reduced. Thus, as shown in FIG. 9, the following structure is given; specifically, the p type semiconductor layer 6 is no formed in the pixel on which red (R) light is incident. Thus, an extra signal of the pixel on which red (R) light is incident is absorbed (discharged) to the lower layer 2b of the n-Epi layer of other color (G, B) pixels via the p$^+$ substrate 1. As a result, this serves to prevent the red signal from being deteriorated.

Sixth Embodiment

Figure 10:
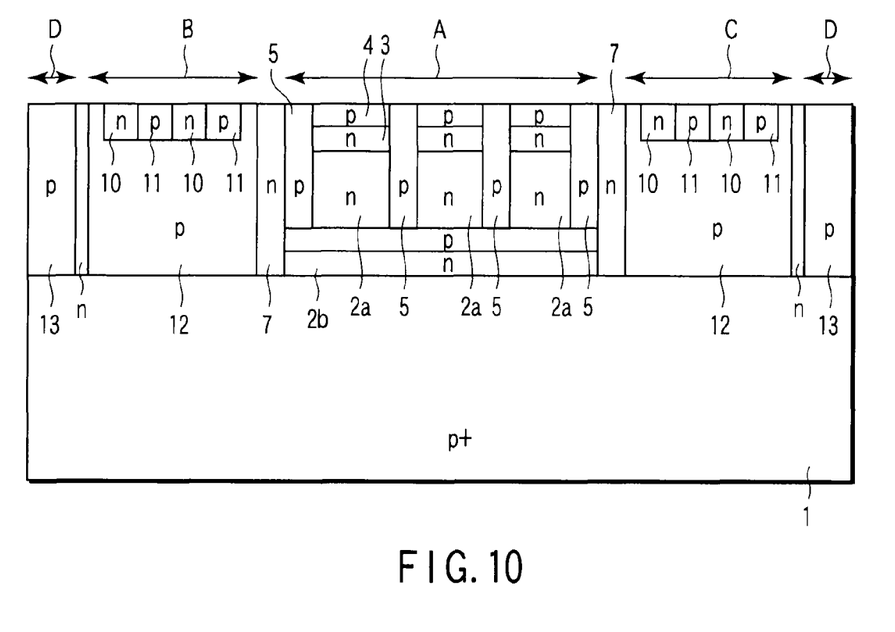
FIG. 10 is a cross-sectional view showing a CMOS image sensor according to a sixth embodiment of the present invention.

According to the sixth embodiment, signal processing circuits such as analog and logic circuits are formed on the same substrate as a CMOS image sensor. FIG. 10 is a cross-sectional view showing part of an array having unit cells of FIG. 1 and part of a signal processing circuit in a CMOS image sensor according to the sixth embodiment.

In FIG. 10, an area A is a pixel area (imaging area) of the CMOS image sensor. An area B is a logic circuit area (digital circuit area). An area C is an analog circuit area. An area D is a dicing line area. In FIG. 10, 10 denotes n well of logic/analog circuit areas, and 11 denotes p well of logic/analog circuit areas. 12 denotes p well formed to connect to the p$^+$ substrate 1 from the substrate surface in the logic and analog circuit areas B and C. 13 denotes a dicing line area, that is, p type semiconductor region. The p type semiconductor region 13 is formed to be connected to the p$^+$ substrate from the substrate surface in a chip cut portion when a semiconductor substrate is cut into some chips. According to the foregoing structure, blooming reduction is realized like the first embodiment.

In the sixth embodiment, the lower layer 2b may be changed into the n type drain layer 8 like the second embodiment. Moreover, each p type semiconductor region 5 may be formed with the n type semiconductor region 7 like the third embodiment. In addition, at least part 5a of the p type semiconductor region 5 is formed to be connected to the p$^+$ substrate 1 like the fourth embodiment.

Seventh Embodiment

Figure 11:
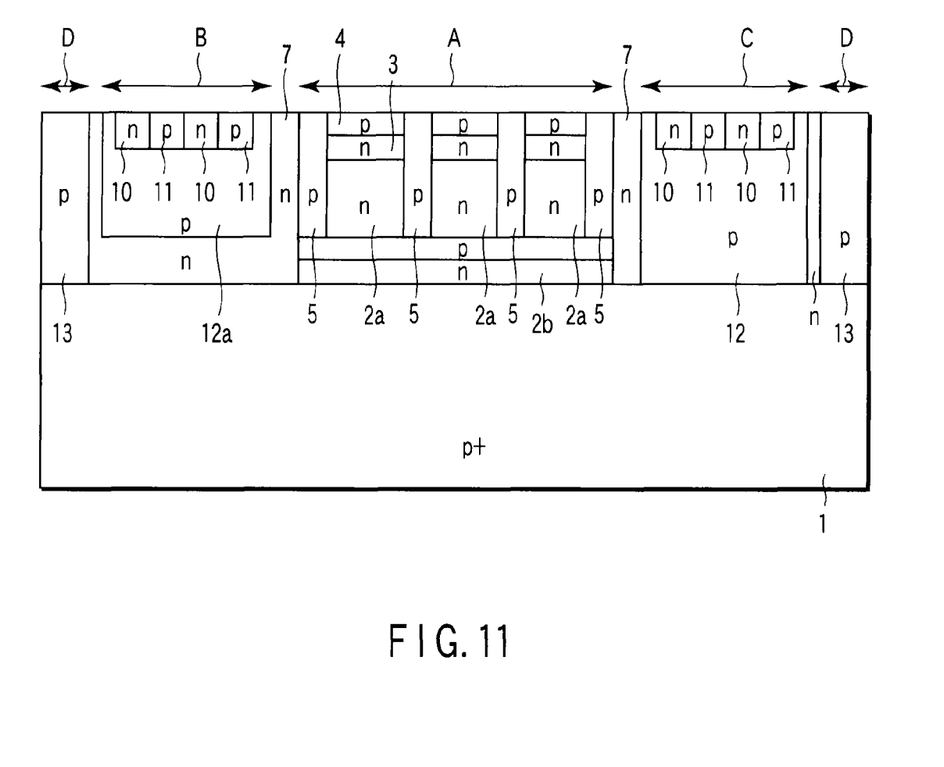
FIG. 11 is a cross-sectional view showing a CMOS image sensor according to a seventh embodiment of the present invention.

FIG. 11 is a cross-sectional view showing part of an array having unit cells of FIG. 1 and part of a signal processing circuit in a CMOS image sensor according to the seventh embodiment. The seventh embodiment differs from the sixth embodiment in the following point. Specifically, p well 12a of a logic circuit area B is formed so that it does not connected with the p$^+$ substrate 1 from the substrate surface (does not reach the p$^+$ substrate 1). Conversely, p well 12b of an analog circuit area C is formed to reach the p$^+$ substrate 1 like the sixth embodiment. The foregoing structure is given, and thereby, blooming reduction is realized like the sixth embodiment.

In the seventh embodiment, the lower layer 2b may be changed into the n type drain layer 8 like the second embodiment. Moreover, each p type semiconductor region 5 may be formed with the n type semiconductor region 7 like the third embodiment. In addition, at least part 5a of the p type semiconductor region 5 is formed to be connected to the p$^+$ substrate like the fourth embodiment.

<Block Configuration of CMOS Image Sensor>

Figure 12:
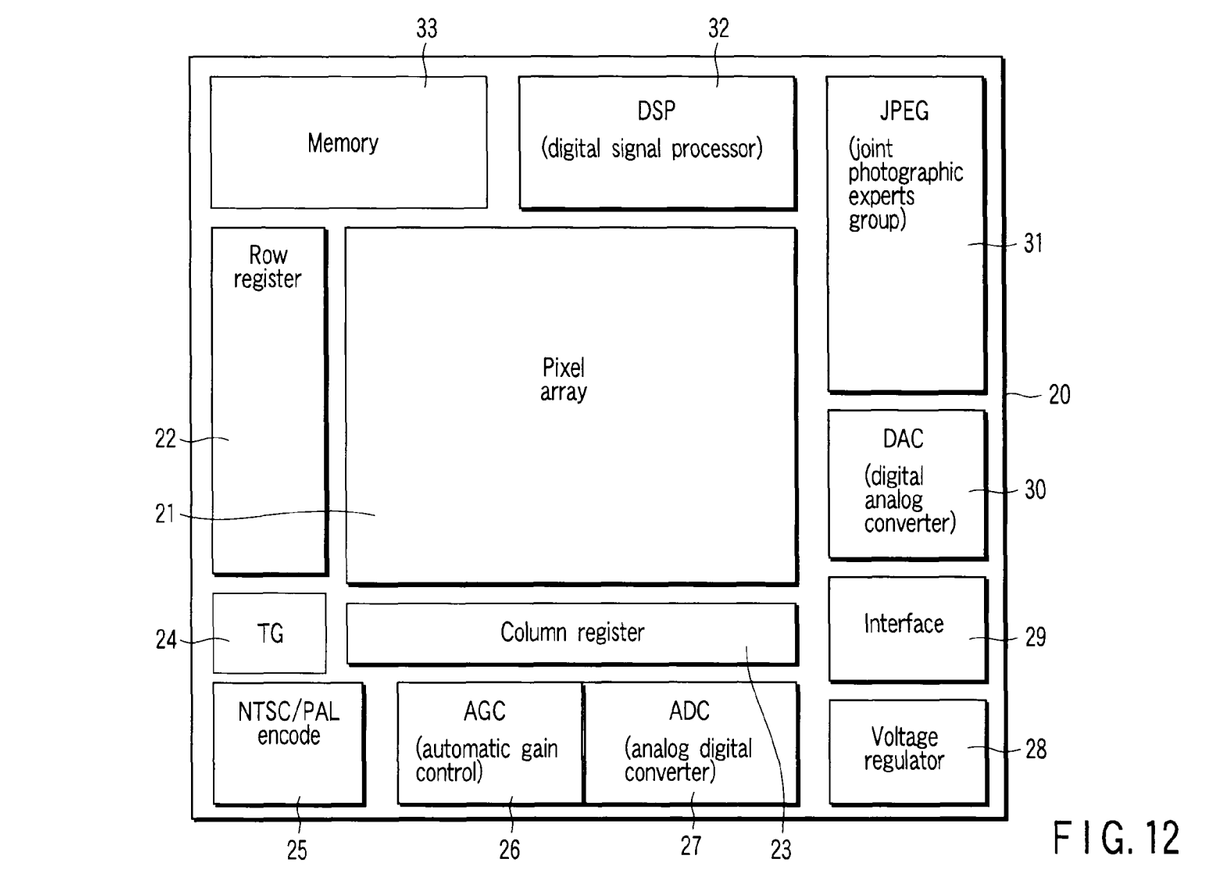
FIG. 12 is a block diagram showing a one-chip CMOS image sensor.

FIG. 12 is a block diagram showing a one-chip CMOS image sensor integrated with an imaging element and signal processing peripheral circuits. A pixel array 21 having the structure according to any of the first to seventh embodiments is arranged on the center portion of a semiconductor chip 20. The following components are arranged around the pixel array 21. For example, the components includes a row register 22, a column register 23, a timing generator circuit (TG) 24, a NTSC/PAL encode circuit 25, and an automatic gain control circuit (AGC circuit) 26. Further, the components includes an analog digital converter (ADC) 27, a voltage regulator circuit 28, an interface circuit 29, a digital analog converter (DAC) 30, a joint photographic experts group (JPEG) circuit 31, a digital signal processor (DSP) 32, and a memory unit 33.

Figure 13:
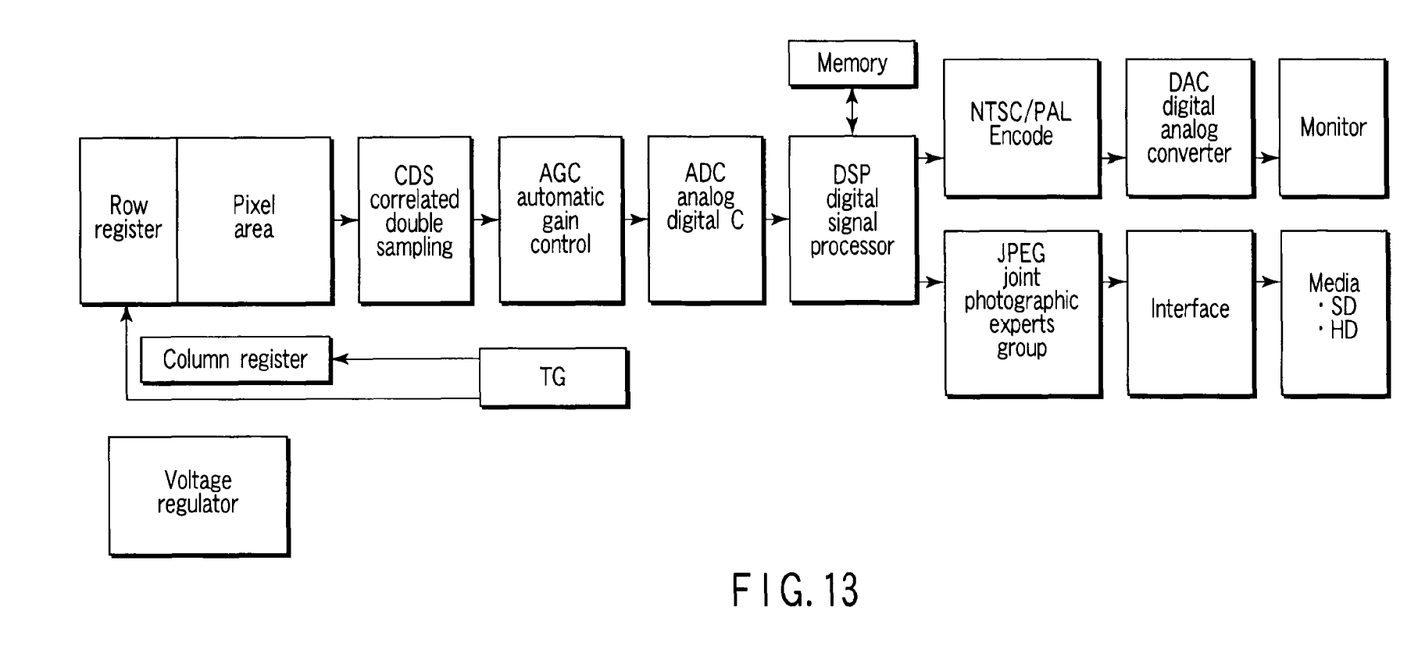
FIG. 13 is a block diagram showing a signal processing flow of the CMOS image sensor shown in FIG. 12.

FIG. 13 shows a signal processing flow of the CMOS image sensor shown in FIG. 12.

The one-chip CMOS image sensor according to each embodiment has the following advantages. Specifically, the substrate structure is improved to enhance sensitivity. Moreover, it is possible to prevent a phenomenon (color mixture) such that carriers leak to neighboring photo diode and blooming, and to reduce leak current in a chip section. Therefore, in the CMOS image sensor according to each embodiment, the sensitivity of the n region of each photo diode without forming the light receiving area of the n region of each photo diode larger or increasing the drive voltage of the CMOS image sensor. In the CMOS image sensor according to each embodiment, image quality reduction such as blooming and color mixture do not almost occur, and a generation of leak current does not almost occur. Each embodiment is effective to solve a problem of sensitivity reduction with cell reduction in the advanced CMOS image sensor.

According to the foregoing each embodiment, it is possible to prevent blooming in the imaging area of the CMOS image sensor using the n/p$^+$ substrate having preferable sensitivity and color mixture characteristic. The present invention is not limited to the foregoing embodiments. Part of structure or manufacturing process is variously improved and changed without departing from the subject matter of the invention. Each embodiment may be properly combined, and then, the invention may be carried out using the combination.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a solid-state imaging device comprising:
   providing an n/p semiconductor substrate having a structure that an n type semiconductor layer is formed on a p type semiconductor substrate;
   forming a plurality of photo diodes on a surface layer of an imaging area of the n type semiconductor layer;
   forming a plurality of p type semiconductor regions surrounding each of the plurality of photo diodes in the n type semiconductor layer;
   forming a p type diffusion layer at a depth of the n type semiconductor layer separating the n type semiconductor layer into an upper layer and a lower layer, the p type diffusion layer connecting the bottoms of the plurality of p type semiconductor regions;

implanting an n type ion in the lower layer of the n type semiconductor layer; and forming an n type peripheral semiconductor layer in the substrate of a peripheral region of the imaging area by implanting an n type ion from a surface of the substrate of the peripheral region of the imaging area, the n type peripheral semiconductor layer extending over the depth at which the p type diffusion layer is formed and up to a depth at which the lower layer of the n type semiconductor layer is formed and being directly connected to the lower layer of the n type semiconductor layer.

2. The method according to claim 1, wherein the n type semiconductor layer formed on the p type semiconductor substrate comprises an n type epitaxial semiconductor layer, and the upper and lower layers of the n type epitaxial semiconductor layer have equal impurity concentration before implanting an n type ion in the lower layer of the n type epitaxial semiconductor layer.

3. The method according to claim 1, wherein an impurity concentration of the p type diffusion layer is lower than that of each of the p type semiconductor regions.

* * * * *